United States Patent
Mayer et al.

(10) Patent No.: US 7,113,049 B2
(45) Date of Patent: Sep. 26, 2006

(54) DEVICE FOR GENERATING OSCILLATIONS IN THE HIGH FREQUENCY RANGE

(75) Inventors: Hermann Mayer, Vaihingen (DE); Sabine Koerber, Ludwigsburg (DE); Bernhard Lucas, Besigheim (DE); Norbert Noethen, Reutlingen (DE); Juergen Seiz, Welzheim (DE); Guido Steude, Reutlingen (DE); Andreas Kugler, Alfdorf (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/503,672

(22) PCT Filed: Dec. 6, 2002

(86) PCT No.: PCT/DE02/04472

§ 371 (c)(1),
(2), (4) Date: Mar. 16, 2005

(87) PCT Pub. No.: WO03/067750

PCT Pub. Date: Aug. 14, 2003

(65) Prior Publication Data

US 2005/0156679 A1    Jul. 21, 2005

(30) Foreign Application Priority Data

Feb. 8, 2002    (DE) ................................ 102 05 183

(51) Int. Cl.
*H03B 5/12*    (2006.01)

(52) U.S. Cl. ............................ 331/107 G; 331/107 DP; 331/117 D; 342/175

(58) Field of Classification Search .................. 331/96, 331/117 D, 107 G, 107 DP; 333/26; 342/175, 342/165
See application file for complete search history.

(56) References Cited

U.S. PATENT DOCUMENTS

| | | | |
|---|---|---|---|
| 4,222,014 A | 9/1980 | Ondria | 331/107 DP |
| 5,126,696 A | 6/1992 | Grote et al. | 331/96 |
| 6,218,916 B1 | 4/2001 | Tanizaki et al. | 333/254 |
| 6,445,256 B1 * | 9/2002 | Haruta et al. | 331/117 D |
| 6,573,803 B1 * | 6/2003 | Ziegner et al. | 333/26 |

FOREIGN PATENT DOCUMENTS

| | | |
|---|---|---|
| DE | 199 06 205 | 8/2000 |
| EP | 1 047 183 | 10/2000 |
| WO | WO 99/03002 | 1/1999 |
| WO | WO 02/075916 | 9/2002 |

* cited by examiner

*Primary Examiner*—Arnold Kinkead
(74) *Attorney, Agent, or Firm*—Kenyon & Kenyon LLP

(57) ABSTRACT

A device for generating electromagnetic oscillations in the HF range, in particular in the gigahertz range, using at least one Gunn element, in particular at least one Gunn diode. The device is designed to be attached to at least one printed-board-like electric or electronic circuit configuration, in particular an electric or electronic HF circuit configuration, having a generally planar expansion.

10 Claims, 2 Drawing Sheets

DEVICE FOR GENERATING OSCILLATIONS IN THE HIGH FREQUENCY RANGE

FIELD OF THE INVENTION

The present invention relates to a device for generating electromagnetic oscillations in the HF range, in particular in the gigahertz range (gHz range), using at least one Gunn element, in particular at least one Gunn diode.

BACKGROUND INFORMATION

In high-frequency circuits and extra-high frequency circuits (frequency f higher than fifty gigahertz), Gunn elements are used for generating the electromagnetic oscillations. Such Gunn elements may be situated in a housing (see, German Application No. DE 199 06 205 A1).

Gunn oscillators are used as HF sources at, for example, 77 gigahertz in applications in vehicle radar units for distance detection and distance regulation. In conventional designs, these Gunn oscillators are connected via a screwable hollow conductor connection to suitable transitions (known as step-transformers), which feed the high-frequency energy into planar distribution networks. The feed of the supply direct voltage takes place as a rule via a manually soldered cable joint.

In this type of transition, however, at least one flanged joint including screw connection and dowel pins is provided which makes the device costly and cumbersome to mount; in addition, the voltage lead wire must be soldered separately according to the related art, and finally, arranged suppression capacitors conventionally require an additional printed board.

SUMMARY

One object of the present invention is to provide a device of the type described above in such a way that it may be mounted in a simple, cost-effective, and expeditious manner.

According to an example embodiment of the present invention, at least one Gunn oscillator is provided which is planarly implementable or SMD (surface mounted device)—implementable and which is mountable on at least one electric or electronic circuit configuration, in particular an electric or electronic HF circuit configuration; this circuit configuration is designed as a printed board and has a generally planar expansion.

It may be particularly advantageous that, due to a simple mounting of the Gunn oscillator, in particular via a clip connection or a plug-in connection, the conventionally necessary flange joints including the screw connection and the dowel pins may be dispensed with. A particularly long-lasting, efficient, and reliable connection to the HF circuit may be established using adhesive or soldering technologies, or a combination of both.

According to an example refinement of the present device, the voltage supply does not take place via separate soldering (as is the case in the related art), but via at least one integrated spring component. Furthermore, the present invention has the advantage that the suppression capacitors do not need an additional printed board.

Finally, the present invention relates to a device, in particular designed as a vehicle radar unit, for detecting and/or adaptively regulating the distance of a transportation means in relation to at least one object, having at least a device of the type explained earlier.

BRIEF DESCRIPTION OF THE DRAWINGS

Additional embodiments, features and advantages of the present invention are explained in greater detail below, in the light of the exemplary embodiment illustrated in FIGS. 1 and 2.

DETAILED DESCRIPTION OF EXAMPLE EMBODIMENTS

Figure 1:
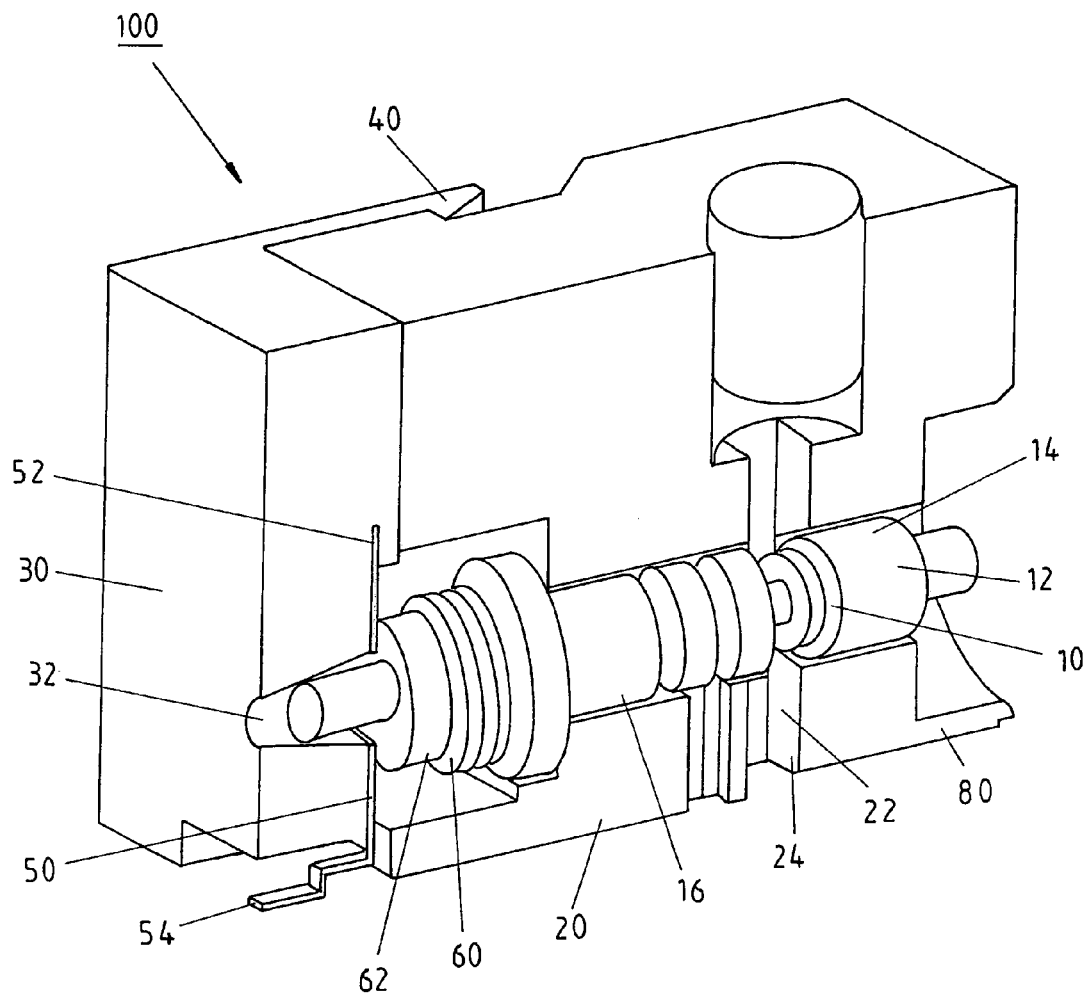
FIG. 1 shows a perspective side view of an exemplary embodiment of a device according to the present invention.
Figure 2:
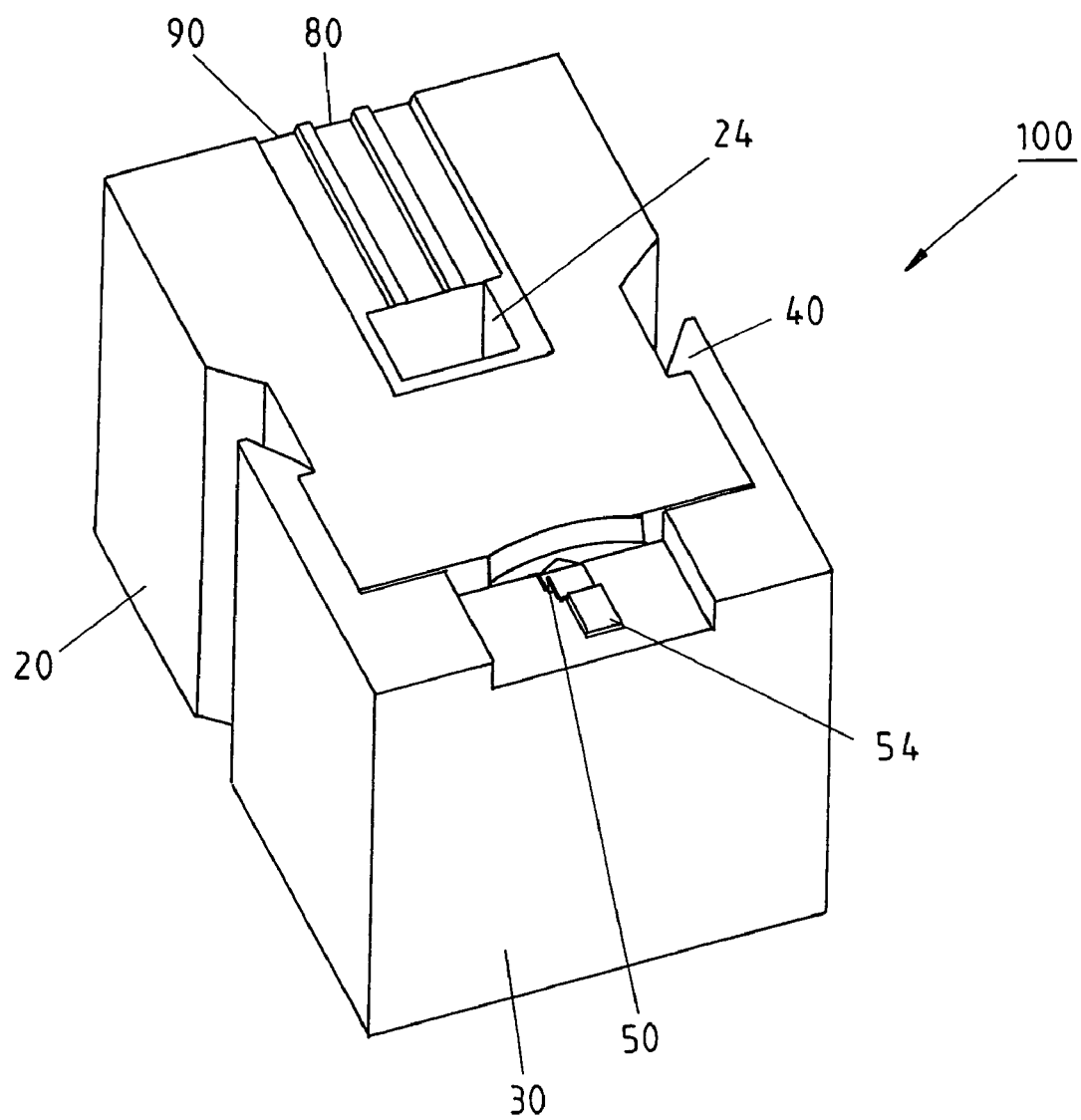
FIG. 2 shows a perspective bottom view of the device shown in FIG. 1.

The same or similar embodiments, elements, or features are indicated in FIGS. 1 and 2 using identical reference numerals.

A Gunn oscillator, i.e., a device 100 for generating electromagnetic oscillations in the HF range, namely in the gigahertz range (gHz range), is shown in the perspective views in FIGS. 1 and 2. This device 100 is part of a device, designed as a vehicle radar unit, for detecting and adaptively regulating the distance of a motor vehicle.

In contrast to the conventional embodiments, FIGS. 1 and 2 show a device 100, which, similarly to an electronic S(urface)M(ounted)D(evice) component, may be implemented directly on a printed-board-like planar HF circuit.

Gunn oscillator 100 has a metallic carrier 20 in the form of an oscillator block including an inserted rectangular or round hollow conductor 22. Virtual Gunn diode 10 protrudes into rectangular or round hollow conductor 22, the Gunn diode being pressed with its integrated heat sink 12 into a first bore 26 of carrier 20 and being additionally locked there against ejection by caulking 14.

Voltage supplying bias choke 16 is oppositely mounted in an additional bore 28 in carrier 20. Bias choke 16 contains (such as in conventional embodiments) a resonator disc and HF filter structures.

An insulating plastic body 30 is laterally attached to oscillator block 20 using a clip connection 40. A metallically conductive (connection) element 50 is inserted into plastic body 30, element 50 being preferably directly injected during manufacture of plastic component 30. Conductive element 50 has on its one end 52 an integral spring structure 60 which exerts a force on bias choke 16, thereby establishing the connection of bias choke 16 with Gunn diode 10.

An electric connection between spring component 60 and bias choke 16 is simultaneously also established. A copper beryllium alloy, having good spring properties as well as good conductivity, is suitable as material for element 50.

Instead of integral spring structure 60, a separate spring element is alternatively also mountable. In this connection, the design of the springy area takes place in such a way that, between the spring and-bias choke 16, a ring-shaped ferrite element 62 may be inserted which is needed for suppressing undesirable current oscillations in the supply.

Plastic element 30 additionally has a particularly conical bore 32, into which the end of bias choke 16 is inserted in order to absorb possible lateral forces excited during mounting or by vibration during vehicle operation.

The other end 54 of injected metal component 50 is molded similar to a terminal pin of an electronic component and is dimensioned in such a way that terminal area 70 of the pin forms a level with exit surface 24 of hollow conductor 22 out of oscillator block 20.

Exit surface 24 on oscillator block 20 additionally has a recess 80, which makes the passage of the HF line on the planar circuit possible. Grooves 90 for catching excess amounts of conductive adhesive or solder are additionally provided.

Gunn oscillator 100, shown here, may be implemented on the HF circuit as an electronic component, the voltage lead wire being contacted at pin 54 of injected metal component 50, while the ground connection takes place on the face of oscillator block 20. Both contacts are produced in one process step which may be fully automated.

SMD soldering as well as conductive bonding may used for establishing the electrical and mechanical connection.

The configuration of Gunn oscillator 100, explained on the basis of the exemplary embodiment according to FIGS. 1 and 2, has the further advantage that possibly necessary additional suppression capacitors may also be placed very close at direct voltage terminal pin 54 on the HF circuit. The additional printed board close to bias choke 16, used in conventional oscillator designs, may be dispensed with.

The invention claimed is:

1. A device for generating electromagnetic oscillations in a high frequency (HF) range, comprising:
    an oscillator device including at least one Gunn element, the oscillator device configured to generate electromagnetic oscillation in a gigahertz (gHz) range;
    wherein the oscillator device is configured for attachment to at least one printed-board-like electric or electronic circuit configuration, the circuit configuration including an electric or electronic HF circuit configuration having a generally planar expansion;
    wherein the oscillator device includes at least one metallic carrier acting as an oscillator block, at least one hollow conductor being inserted into the carrier, the Gunn element protruding into the hollow conductor, the hollow conductor being one of rectangular or round.

2. The device as recited in claim 1, wherein the Gunn element is a Gunn diode.

3. The device as recited in claim 1, wherein the oscillator device is configured for attachment to the circuit configuration as a surface mounted device (SMD) component.

4. The device as recited in claim 1, wherein at least one of i) an electrical connection, and ii) mechanical connection between the oscillator device and the circuit configuration is provided via at least one of: i) a conductive adhesion, and ii) a SMD soldering.

5. The device as recited in claim 1 wherein at least one of:
    i) the Gunn element and at least one integrated heat sink is fitted into at least one bore of the carrier and is locked in the bore against ejection using at least one caulking element, and
    ii) a voltage-supplying bias choke, having at least one resonator disc and HF filter structures, is mounted in at least one additional bore of the carrier.

6. The device as recited in claim 5, further comprising:
    at least one plastic body made of insulating material laterally attached to the carrier via at least one of a clip connection or a plug-in connection.

7. The device as recited in claim 6, wherein at least one of:
    i) at least one connecting element made of metallically conductive material and injected during manufacture of the plastic body is inserted into the plastic body, a spring structure, exerting a force on the bias choke and establishing a connection between the bias choke and the Gunn element, being integrally molded on one end area of the connecting element, and
    ii) the oscillator device further includes at least one separate spring element, a springy area of the spring element being configured in a way that at least one ring-shaped element, made of ferrite and configured to suppress oscillations of a supply, is insertable between the spring element and the bias choke.

8. The device as recited in claim 1, wherein an area of a connecting element is configured as at least one terminal area, the terminal area including at least one terminal pin of an electronic component, and being dimensioned in such a way that the terminal area lies on a level with an exit surface of the hollow conductor out of the carrier.

9. The device as recited in claim 8, wherein the exit surface of the hollow conductor out of the carrier has at least one of:
    i) at least one recess configured for a passage of at least one HF line on the circuit configuration; and
    ii) at least one groove which is provided for catching at least one of excess conductive adhesive, and excess SMD solder.

10. A vehicle radar unit, for detecting and/or adaptively regulating a distance of a transportation device with regard to at least one object, the radar unit comprising:
    an oscillator device including at least one Gunn element, the oscillator device configured to generate electromagnetic oscillations in a gigahertz (gHz) range;
    wherein the oscillator device is configured for attachment to at least one printed-board-like electric or electronic circuit configuration, the circuit configuration including an electric or electronic HF circuit configuration having a generally planar expansion;
    wherein the oscillator device includes at least one metallic carrier acting as an oscillator block, at least one hollow conductor being inserted into the carrier, the Gunn element protruding into the hollow conductor, the hollow conductor being one of rectangular or round.

* * * * *